United States Patent
Bachrach (10) Patent No.: US 7,914,246 B2
(45) Date of Patent: Mar. 29, 2011

(54) ACTUATABLE LOADPORT SYSTEM

(75) Inventor: Robert Z. Bachrach, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/484,291

(22) Filed: Jun. 15, 2009

(65) Prior Publication Data

US 2009/0252583 A1    Oct. 8, 2009

Related U.S. Application Data

(63) Continuation of application No. 10/444,530, filed on May 23, 2003, now abandoned, and a continuation of application No. 09/755,394, filed on Jan. 5, 2001, now abandoned.

(51) Int. Cl.
*B65G 47/90* (2006.01)

(52) U.S. Cl. ............... 414/222.01; 414/217.1; 414/940

(58) Field of Classification Search ............ 414/610, 414/615, 626, 940, 217.1, 222.01, 281
See application file for complete search history.

(56) References Cited

U.S. PATENT DOCUMENTS

| | | | |
|---|---|---|---|
| 2,554,118 A | 5/1951 | Moser | |
| 2,796,283 A | 6/1957 | Grazier | |
| 3,663,052 A | 5/1972 | Schurch | |
| 3,890,185 A | 6/1975 | Umazume | |
| 5,261,935 A | 11/1993 | Ishii et al. | |
| 5,372,241 A | 12/1994 | Matsumoto | |
| 5,431,600 A | 7/1995 | Murata et al. | |
| 5,464,313 A | 11/1995 | Ohsawa | |
| 5,628,604 A | 5/1997 | Murata et al. | |
| 5,957,648 A | 9/1999 | Bachrach | |
| 5,964,561 A | 10/1999 | Marohl | |
| 5,980,183 A | 11/1999 | Fosnight | |
| 6,280,134 B1 | 8/2001 | Nering | |
| 6,283,692 B1 | 9/2001 | Perlov et al. | |
| 6,379,096 B1 | 4/2002 | Beutler et al. | |
| 6,427,824 B1 | 8/2002 | Murata et al. | |
| 6,443,686 B1 | 9/2002 | Wiesler et al. | |

(Continued)

FOREIGN PATENT DOCUMENTS

CH    678940    11/1991

(Continued)

OTHER PUBLICATIONS

Notice of Allowance of U.S. Appl. No. 10/444,530 mailed Jan. 11, 2010.

(Continued)

*Primary Examiner* — Charles A Fox
(74) *Attorney, Agent, or Firm* — Dugan & Dugan (57) ABSTRACT

A system adapted to exchange wafer carriers between an overhead transport mechanism and a platform is provided. The system employs a wafer carrier having at least one handle extending therefrom, an overhead transfer mechanism, a transporter coupled to the overhead transfer mechanism and adapted to move therealong and having a wafer carrier coupling mechanism adapted to couple to the at least one wafer carrier handle, a platform positioned below the overhead transfer mechanism such that wafer carriers traveling along the overhead transfer mechanism travel over the platform, and an actuator coupled to the platform and adapted so as to elevate the platform to an elevation wherein the loading platform may contact the bottom of a wafer carrier coupled to the overhead transfer mechanism.

20 Claims, 8 Drawing Sheets

U.S. PATENT DOCUMENTS

| | | |
|---|---|---|
| 6,454,512 B1 | 9/2002 | Weiss |
| 6,506,009 B1 | 1/2003 | Nulman et al. |
| 6,540,466 B2 | 4/2003 | Bachrach |
| 6,579,052 B1 | 6/2003 | Sonora et al. |
| RE38,221 E * | 8/2003 | Gregerson et al. ............ 206/711 |
| 6,955,517 B2 | 10/2005 | Nulman et al. |
| 7,168,553 B2 | 1/2007 | Rice et al. |
| 7,230,702 B2 | 6/2007 | Rice et al. |
| 7,234,908 B2 | 6/2007 | Nulman et al. |
| 7,243,003 B2 | 7/2007 | Elliott et al. |
| 7,346,431 B2 | 3/2008 | Elliott et al. |
| 7,359,767 B2 | 4/2008 | Elliott et al. |
| 7,360,981 B2 | 4/2008 | Weaver |
| 7,409,263 B2 | 8/2008 | Elliott et al. |
| 7,433,756 B2 | 10/2008 | Rice et al. |
| 2002/0090282 A1 | 7/2002 | Bachrach |
| 2003/0031538 A1 | 2/2003 | Weaver |
| 2003/0110649 A1 | 6/2003 | Hudgens |
| 2003/0202865 A1 | 10/2003 | Ponnekanti |
| 2003/0202868 A1 | 10/2003 | Bachrach |
| 2004/0081546 A1 | 4/2004 | Elliott et al. |
| 2005/0135903 A1 | 6/2005 | Rice et al. |
| 2005/0167554 A1 | 8/2005 | Rice et al. |
| 2006/0072986 A1 | 4/2006 | Perlov et al. |
| 2007/0237609 A1 | 10/2007 | Nulman et al. |
| 2007/0258796 A1 | 11/2007 | Englhardt et al. |
| 2007/0274813 A1 | 11/2007 | Elliott et al. |
| 2008/0050217 A1 | 2/2008 | Rice et al. |
| 2008/0051925 A1 | 2/2008 | Rice et al. |
| 2008/0071417 A1 | 3/2008 | Rice et al. |
| 2008/0187414 A1 | 8/2008 | Elliott et al. |
| 2008/0187419 A1 | 8/2008 | Rice et al. |
| 2008/0213068 A1 | 9/2008 | Weaver |
| 2008/0286076 A1 | 11/2008 | Elliott et al. |
| 2009/0030547 A1 | 1/2009 | Rice et al. |

FOREIGN PATENT DOCUMENTS

| | | |
|---|---|---|
| EP | 0 138 473 | 4/1985 |
| EP | 0 358 443 | 3/1990 |
| EP | 0 675 523 | 10/1995 |
| JP | 03048439 | 3/1991 |
| JP | 405017006 | 1/1993 |
| JP | 11-348851 A | 12/1999 |
| JP | 2000-012644 | 1/2000 |
| KR | 1019980064020 | 10/1998 |
| KR | 1020000055597 | 9/2000 |
| WO | WO 87/04043 | 7/1987 |
| WO | WO 98/58402 | 12/1998 |
| WO | WO 99/02436 | 1/1999 |

OTHER PUBLICATIONS

U.S. Appl. No. 12/359,310, filed Jan. 24, 2009.
Office Action of Chinese Patent Application No. 02119070.4 dated Aug. 12, 2005.
Office Action of Korean Patent Application No. 10-2002-0000569 dated Nov. 23, 2007.
Second Office Action of Korean Patent Application No. 10-2002-0000569 dated Mar. 24, 2009.
Office Action of Chinese Application for Invention No. 200610101530.0 dated Jul. 20, 2007.
Second Office Action of Chinese Application for Invention No. 200610101530.0 dated Sep. 19, 2008.
Final Office Action of Chinese Application for Invention No. 200610101530.0 dated May 8, 2009.
Office Action of Taiwan Patent Application No. 090133368 dated Mar. 19, 2003.
Office Action of U.S. Appl. No. 09/755,394 mailed Dec. 11, 2002.
Notice of Abandonment of U.S. Appl. No. 09/755,394 mailed Aug. 12, 2003.
Office Action of U.S. Appl. No. 10/444,530 mailed May 24, 2004.
Aug. 24, 2004 Response to Office Action of U.S. Appl. No. 10/444,530 mailed May 24, 2004.
Office Action of U.S. Appl. No. 10/444,530 mailed Nov. 16, 2004.
Feb. 10, 2005 Response to Office Action of U.S. Appl. No. 10/444,530 mailed Nov. 16, 2004.
Final Office Action of U.S. Appl. No. 10/444,530 mailed May 20, 2005.
Appeal Brief of U.S. Appl. No. 10/444,530, filed Apr. 18, 2006.
Appeal Brief of U.S. Appl. No. 10/444,530, filed Jul. 24, 2006.
Appeal Brief of U.S. Appl. No. 10/444,530, filed Sep. 15, 2006.
Examiner's Answer to Appeal Brief of U.S. Appl. No. 10/444,530 mailed Nov. 24, 2006.
BPAI Decision of U.S. Appl. No. 10/444,530 mailed Apr. 14, 2009.
Notice of Abandonment of U.S. Appl. No. 10/444,530 mailed Apr. 26, 2010.

* cited by examiner

ACTUATABLE LOADPORT SYSTEM

This application is a continuation of U.S. patent application Ser. No. 10/444,530, filed May 23, 2003, which is a continuation of U.S. patent application Ser. No. 09/755,394, filed Jan. 5, 2001, now abandoned, the disclosures of each of which are hereby incorporated by reference herein in their entirety.

FIELD OF THE INVENTION

The present invention relates generally to fabrication systems and more particularly to an improved method and apparatus for loading and unloading wafer carriers to and from a tool.

BACKGROUND OF THE INVENTION

A factory for manufacturing semiconductor substrates (e.g., patterned or unpatterned wafers) is conventionally known as a "FAB." Within a FAB, an overhead transport mechanism may transport semiconductor wafers in what is known as a wafer carrier (e.g., a sealed pod, a cassette, a container, etc.) between various processing systems, wherein a wafer carrier is placed on a mechanism known as a loadport (i.e., a mechanism or location which receives and supports a wafer carrier at a given tool). Certain loadports referred to herein as fabrication tool loadports, support a wafer carrier while wafers are extracted from the wafer carrier and transported into a processing system coupled thereto. Others simply receive a wafer carrier within a storage buffer, where the wafer carrier is stored for subsequent transport to a fabrication tool loadport.

Typically, wafer carriers are received in a storage buffer via an elevated or overhead loadport that receives wafer carriers from an overhead transport mechanism. Thereafter a storage buffer robot may transfer the wafer carrier from the overhead loadport to another storage shelf or to a fabrication tool loadport or to a conventional SEMI Standard E15 loadport that exchanges wafer carriers with an overhead transport mechanism. To lower the wafer carrier from an overhead transport mechanism to an overhead loadport, a robot capable of multi-axis movement may be employed, etc. The complex multi-axis movement required by such a loader robot in order to transfer a wafer carrier between the overhead transfer mechanism and the overhead loadport increases equipment expense and reduces equipment reliability.

Also, conventionally wafer carriers have kinematic mounts (i.e., mechanical couplings used to align a wafer carrier on a platform, such as a loadport), which engage corresponding kinematic mount locations on a loadport. Thus, the loader robot must be tightly toleranced to accurately position the wafer carrier on the loadport such that the wafer carrier's kinematic mounts may engage the loadport's kinematic mount locations. Such tight tolerance requirements may increase equipment costs while reducing equipment throughput.

Accordingly, there is a need for an improved system that may transfer wafer carriers between an overhead transport mechanism and a loadport.

SUMMARY OF THE INVENTION

The present invention provides a system for storing and moving wafer carriers. The system includes an overhead transport mechanism adapted to support a plurality of wafer carriers and transport the plurality of wafer carriers along a wafer carrier transport path; a plurality of transporters adapted to move along the overhead transport mechanism, each transporter including: end effectors adapted to engage handles of a wafer carrier, and a coupling mechanism adapted to couple the transporter to the overhead transport mechanism; a storage apparatus frame adapted to be positioned adjacent the overhead transport mechanism; at least one shelf supported by the frame and adapted to support and store a wafer carrier; and a movable portion supported by the storage apparatus frame, the movable portion being adapted to extend and retract relative to the frame, so as to contact a wafer carrier supported by the overhead transport mechanism, and so as to remove the wafer carrier from the overhead transport mechanism by elevating the handles of the wafer carrier above a level of the end effectors, such that the movable portion supports the wafer carrier and the adjacent overhead transport mechanism no longer supports the wafer carrier.

According to another aspect, a system for storing and moving a plurality of wafer carriers is provided. The system includes an overhead transport mechanism adapted to support a plurality of wafer carriers and transport the plurality of wafer carriers along a wafer carrier transport path; a plurality of transporters adapted to move along the overhead transport mechanism, each transporter including: end effectors adapted to engage handles of a wafer carrier, and a coupling mechanism adapted to couple the transporter to the overhead transport mechanism; a storage apparatus frame adapted to be positioned adjacent the overhead transport mechanism; a robot supported by the frame and adapted to move wafer carriers relative to the frame; at least one shelf supported by the frame and adapted to support and store a wafer carrier; and a movable portion supported by the frame, the movable portion being adapted to extend and retract relative to the frame, so as to contact a wafer carrier supported by a transporter of the overhead transport mechanism, and so as to remove and disengage the wafer carrier from the transporter of the overhead transport mechanism by elevating the handles of the wafer carrier above a level of the end effectors, such that the movable portion supports the wafer carrier and the adjacent overhead transport mechanism no longer supports the wafer carrier.

In another system aspect, a system for storing and moving a plurality of wafer carriers is provided which includes an overhead transport mechanism adapted to support a plurality of wafer carriers and transport the plurality of wafer carriers along a wafer carrier transport path; a plurality of transporters adapted to move along the overhead transport mechanism, each transporter including: end effectors adapted to engage handles on a wafer carrier, and a coupling mechanism adapted to couple the transporter to the overhead transport mechanism; a storage apparatus frame adapted to be positioned adjacent the overhead transport mechanism; a plurality of shelves supported by the frame and adapted to support and store wafer carriers; and a wafer carrier transport apparatus supported by the frame, the wafer carrier transport apparatus including a robot adapted to move wafer carriers relative to the frame and wherein the wafer carrier transport apparatus is adapted to extend and retract relative to the frame, so as to contact a wafer carrier supported by a transporter of the overhead transport mechanism so as to remove and disengage the wafer carrier from the transporter of the overhead transport mechanism by elevating the handles of the wafer carrier above a level of the end effectors, such that the wafer carrier apparatus supports the wafer carrier and the adjacent overhead transport mechanism no longer supports the wafer carrier.

In yet another aspect, an apparatus for storing and moving wafer carriers is provided. The apparatus includes a frame adapted to be positioned adjacent an overhead transport mechanism adapted to support a plurality of wafer carriers and transport the plurality of wafer carriers along a wafer carrier transport path; at least one shelf supported by the frame and adapted to support and store a wafer carrier; a movable portion supported by the frame, the movable portion being adapted to extend and retract relative to the frame, so as to contact a wafer carrier supported by the overhead transport mechanism, and so as to remove the wafer carrier from the overhead transport mechanism, such that the movable portion supports the wafer carrier and the adjacent overhead transport mechanism no longer supports the wafer carrier; and a first actuator adapted to extend and retract the movable portion relative to the frame; wherein the movable portion is further adapted to extend laterally relative to the frame so as to align with the wafer carrier supported by the overhead transfer mechanism; and wherein the movable portion is adapted to extend laterally by rotating through an arc relative to the frame.

The invention further comprises a method of transferring wafer carriers between an overhead transport mechanism and a platform, by elevating the platform so as to contact a wafer carrier supported by the overhead transport mechanism, and so as to release the wafer carrier from the overhead transport mechanism. Thereafter, the platform is lowered to an overhead loadport height.

An inventive wafer carrier comprising at least a first handle comprising a groove, such as an inverted "v-shaped" groove, along a lower surface thereof, is further provided.

Other features and aspects of the present invention will become more fully apparent from the following detailed description of the preferred embodiments, the appended claims and the accompanying drawings.

DETAILED DESCRIPTION OF THE PREFERRED EMBODIMENTS

Figure 1:
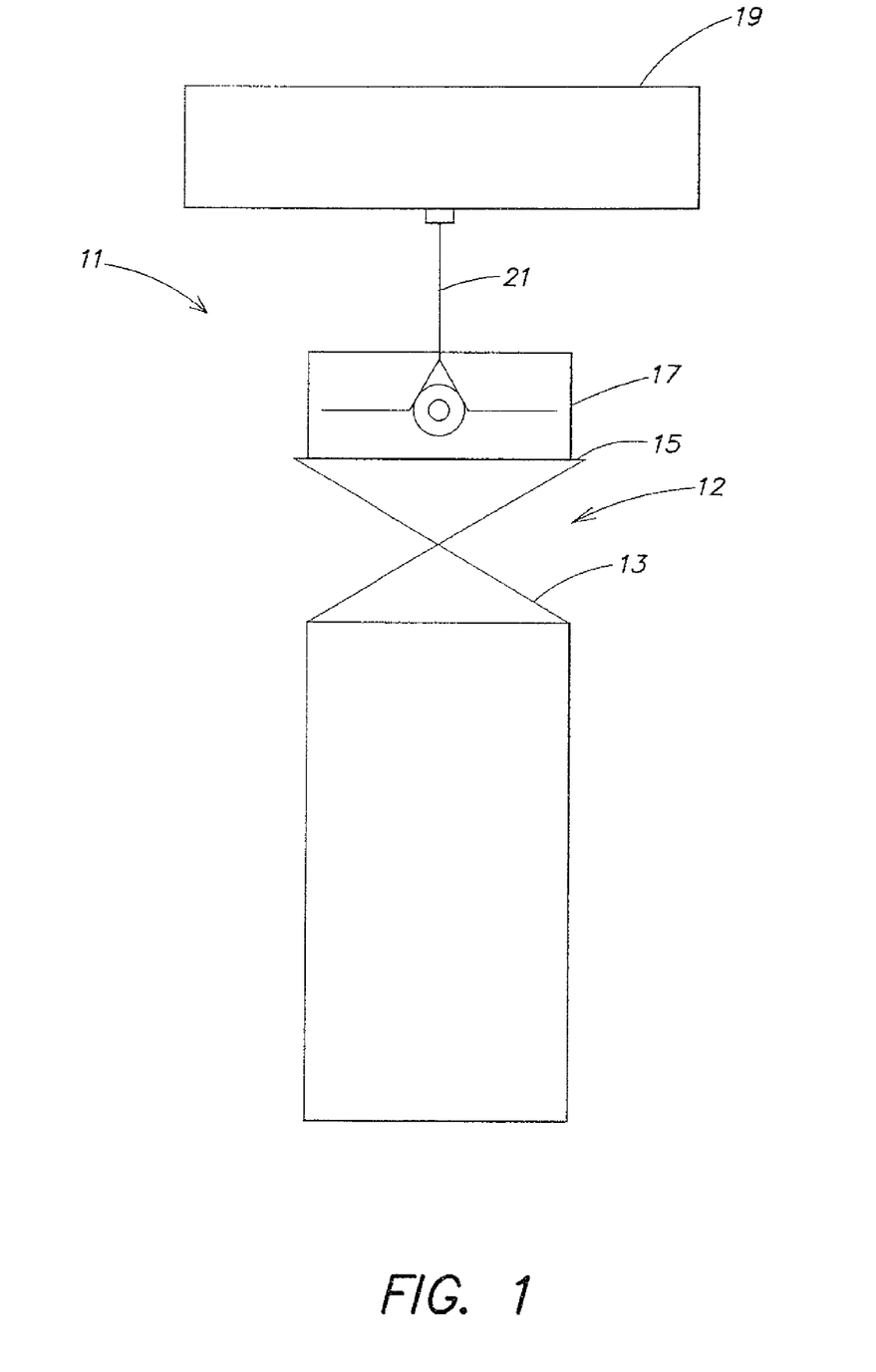
FIG. 1 is a side schematic view, in pertinent part, of an overhead transport system and an inventive loadport for use therewith.

FIG. 1 is a side schematic view, in pertinent part, of an inventive overhead transport system 11 that comprises an inventive loadport 12, having a lift actuator 13 that may elevate a platform 15) to an elevation wherein the platform 15 may contact a wafer carrier 17 (e.g., a sealed pod, an open cassette, etc.) being transported by an overhead transport mechanism 19 (e.g., an overhead conveyor). The inventive overhead transport system 11 may further comprise the wafer carrier 17, the overhead transport mechanism 19, and a plurality of transporters 21 adapted to move along the overhead transport mechanism 19. The inventive overhead transport system 11 may also comprise alignment marks or sensors 51 and 53 (FIGS. 4A-5D) adapted to transmit a signal when the wafer carrier 17 is in a predetermined position relative to the loading platform 15.

The operation of the inventive overhead transport system 11 is further described below with reference to FIGS. 4A-D and FIGS. 5A-D, which illustrate the inventive overhead transport system 11 in more detail than that shown in FIG. 1. Before discussing the overall operation of the inventive overhead transport system 11, it is best to understand the configuration of the exemplary types of wafer carriers that may be employed therewith. Specifically, the opposing sides of the wafer carrier 17 may have a twist-on location (e.g., a threaded or Bayonette extension) such that a handle (e.g., having corresponding threads or wings) may be removably coupled to the twist-on location. The twist-on location 35 (FIGS. 2 and 3) may be positioned at the wafer carrier 17's center of gravity so as to minimize vibration of the water carrier 17 while the wafer carrier 17 is being transported by the overhead transfer mechanism 19. Two types of handles may be used with the wafer carrier 17. The first type of handle may comprise a conventional bar as described further below with reference to FIG. 2, and the second type of handle may comprise an inventive inverted V-shaped handle as described further below with reference to FIG. 3.

Figure 2:
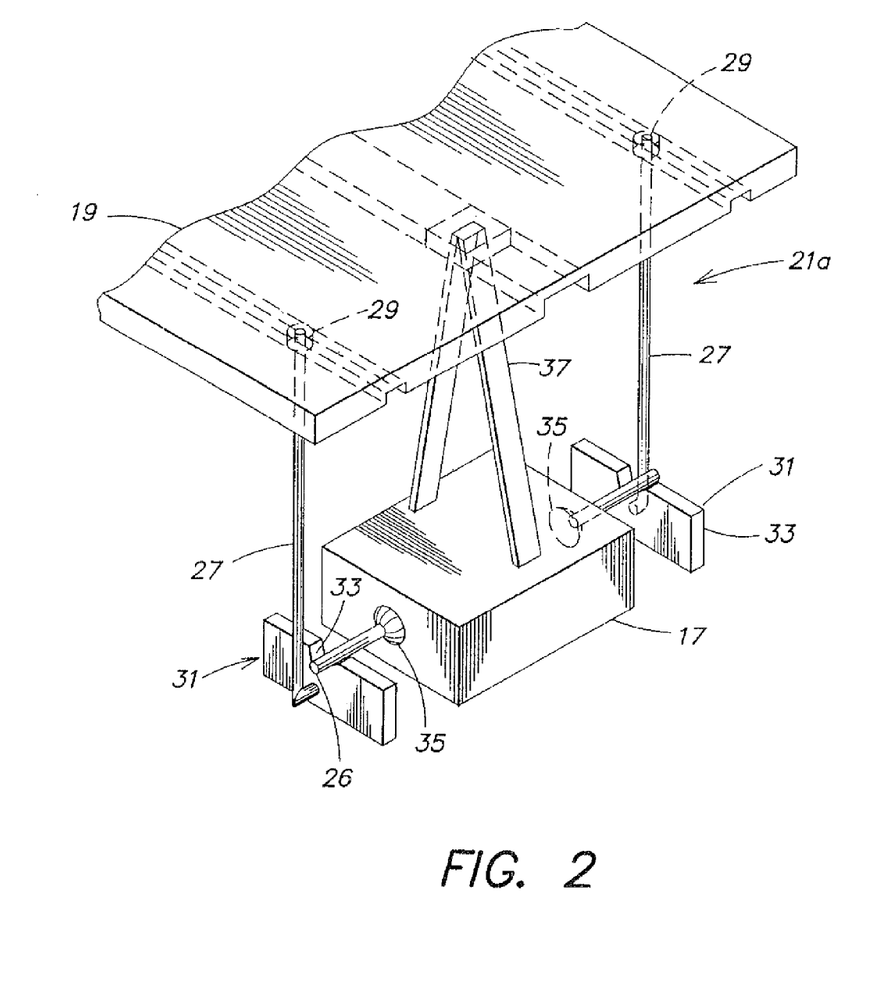
FIG. 2 is a front perspective view of the wafer carrier having a conventional bar-type handle attached thereto, shown coupled to an overhead transporter.

FIG. 2 is a front perspective view of a wafer carrier 17 having a conventional bar-type handle 26 attached thereto, shown coupled to the transporter 21a. The transporter 21a may comprise a pair of grippers 27 adapted to be positioned on opposing sides of the wafer carrier 17, and a coupling mechanism 29 adapted to couple the transporter 21a to the overhead transfer mechanism 19 and to allow the transporter 21a to move therealong as is conventionally known. In one aspect, the grippers 27 have no moving components (i.e., are fixed). Specifically, the grippers 27 extend downwardly from the coupling mechanism 29, and the distance between the grippers 27 is larger than the width of the wafer carrier 17. The grippers 27 may comprise an end effector 31 adapted to couple to the conventional bar-type handle 26. As shown in FIG. 2, the end effector 31 may have a groove 33 that has, for example, a V-shape (as shown), a U-shape (not shown), or any other similar shape which may "grasp", cradle or otherwise engage the conventional bar-type handle 26 from below. The twist-on location 35 (FIGS. 2 and 3) may be positioned at the wafer carrier 17's center of gravity so as to minimize vibration of the wafer carrier 17 while the wafer carrier 17 is being manually transported or is being transported by the overhead transfer mechanism 19.

The transporter 21a may further comprise a rocking restraint 37 such as a pair of rigid extensions that extend downwardly from the coupling mechanism 29 to a position close to the top of the wafer carrier 17, and are thus adapted to minimize rocking (e.g., forward and backward) of the wafer carrier 17 as the wafer carrier 17 is being transported by the overhead transfer mechanism 19.

Figure 3:
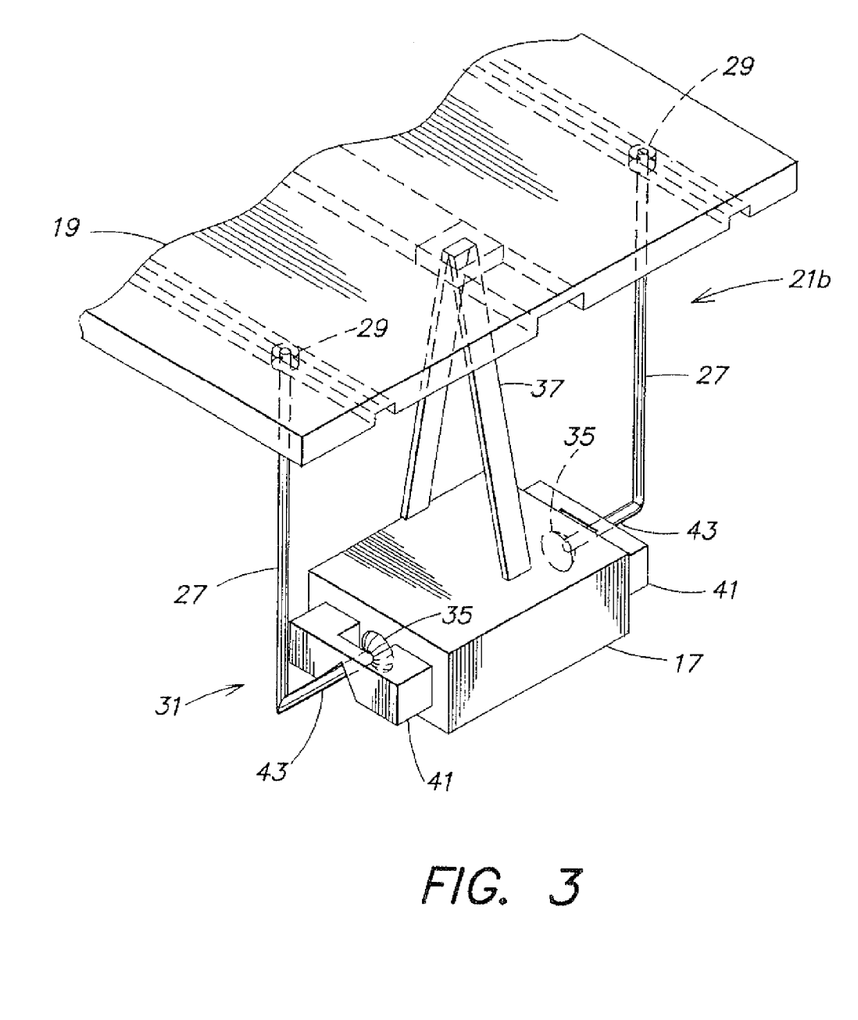
FIG. 3 is a front perspective view of a wafer carrier having an inventive V-shaped handle attached thereto, shown coupled to an overhead transporter.

FIG. 3 is a front perspective view of the wafer carrier 17 having an inventive V-shaped handle 41 attached thereto, shown coupled to the transporter 21b. The transporter 21b may comprise the same components as the transporter 21a of FIG. 2. In this aspect, however, the end effector 31 may comprise a rod 43 that is adapted to couple to the V-shaped handle 41 of the wafer carrier 17. As previously described, the inventive V-shaped handle 41 may comprise a threaded region that may be screwed onto a threaded region of the twist-on location 35. In operation, the groove 33 of the inventive V-shaped handle 41 may "grasp", cradle or otherwise engage the rod 43 of the transporter 21b, such that the transporter 21b may be lifted and lowered thereby.

The components of the inventive overhead transport system 11 are described further with joint reference to FIGS. 4A-5D, which are useful in describing the operation of the inventive overhead transport system 11, as a wafer carrier 17 is transferred between the overhead transport mechanism 19 and the loading platform 15. FIGS. 4A-D are schematic side plan views of the inventive overhead transport system 11, and FIGS. 5A-D are the respective front plan views of the inventive overhead transport system 11 that correspond to FIGS. 4A-4D.

Generally, in operation, a transporter 21 carries a wafer carrier 17 into position above the inventive loadport 17. The inventive loadport 17 then elevates such that the handles 41 of the wafer carrier 17 disengage the transporter's end effectors. The transporter then moves forward and the inventive loadport is able to lower the wafer carrier to a position from which the wafer carrier 17 can be extracted and loaded to a fabrication tool. To accomplish such wafer carrier transfer between an overhead transporter and a fabrication tool, the lift actuator 13 is coupled to the platform 15 so as to elevate the platform 15 to an elevation wherein the platform 15 may contact the bottom of a wafer carrier 17 being transported by the overhead transfer mechanism 19. The lift actuator 13 may lift and lower the platform 15 between various positions including: (1) an upper position in which the platform 15 has elevated the wafer carrier 17 such that the handle thereof is above the level of the transporter 21a, 21b's end effector 33 thus lifting the wafer carrier 17 off of the transporter 21; and (2) a lower position in which the platform 15 has lowered the wafer carrier 17 so that a robot 45, 65 (FIGS. 6 and 7) may access the wafer carrier 17.

In order to avoid collision, the distance between the top of a wafer carrier 17 supported by the platform 15 and the overhead transport mechanism 19 is larger than the distance between the overhead transport mechanism 19 and the bottom of a wafer carrier 17 being transported thereby (the distance being measured when the platform 15 is in the lower position). Thus, the wafer carrier 17 may not contact the overhead transport mechanism 19 or any overhead portion of the transporter 21a, 21b when the loading platform 15 is in the upper position (assuming the wafer carrier 17 is disengaged form the rods). Also, the distance between the top of the wafer carrier 17 and the rocking restraint 37 measured before the platform 15 contacts the wafer carrier 17, is larger than the distance between the top of the wafer carrier 17 and the rocking restraint 37 measured when the loading platform 15 is in the upper position. Thus, the wafer carrier 17 may not contact the rocking restraint 37 when the loading platform 15 is in the upper position, unless the wafer carrier 17 rocks forward or backward.

The platform 15 may be positioned below the overhead transport mechanism 19 such that a wafer carrier 17 that is being transported by the overhead transport mechanism 19 may travel over the loading platform 15. In one aspect, the platform 15 may be a top shelf of a storage apparatus (e.g., a local buffer) that may comprise a plurality of shelves and one or more loadports as described further below with reference to FIG. 6.

The alignment sensors may comprise a light transmitter 51, such as a light emitting diode (LED) and a receiver 53, such as a photodetector. A microcontroller 55 may be coupled to the lift actuator 13 and adapted to control the operation thereof. The microcontroller 55 may be further adapted to receive a signal from the receiver 53 indicating the wafer carrier 17 is in position above the platform 15. Specifically, in one aspect, the alignment sensors 25 may employ the use of a "through-beam" technique whereby the light transmitter 51 is positioned so as to transmit a light beam to the receiver 53 "through" a path traveled by a wafer carrier 17 as it travels along the overhead transfer mechanism 19. The light transmitter 51 may be positioned on the platform 15 and the receiver 53 may be positioned on the overhead transfer mechanism 19.

When a wafer carrier 17 being transported by the overhead transport mechanism 19 is above the loading platform 15, the wafer carrier 17 may block a beam of light that is transmitted by the transmitter 51. When a wafer carrier 17 is not above the loading platform 15, the receiver 53 may detect a beam of light that is transmitted by the light transmitter 51 (i.e., the beam of light may pass through). An output of the receiver 53 may have a "first signal" value when the beam of light contacts the receiver 53, and may have a "second signal" when the beam of light does not contact the receiver 53. As a further precaution, the lift actuator 13 may lift and lower the platform 15 only when the microcontroller 55 receives a "second signal" from the receiver 53.

The operation of the inventive overhead transport system 11, employing the transporter 21b of FIG. 3 (with the wafer carrier 17 having the inventive V-shaped handle 41 attached thereto) is described with reference to the sequential views of FIGS. 4A-D and FIGS. 5A-D, which show the movement of the wafer carrier 17 as the wafer carrier 17 travels between the overhead transfer mechanism 19 and the platform 15.

Figure 4A:
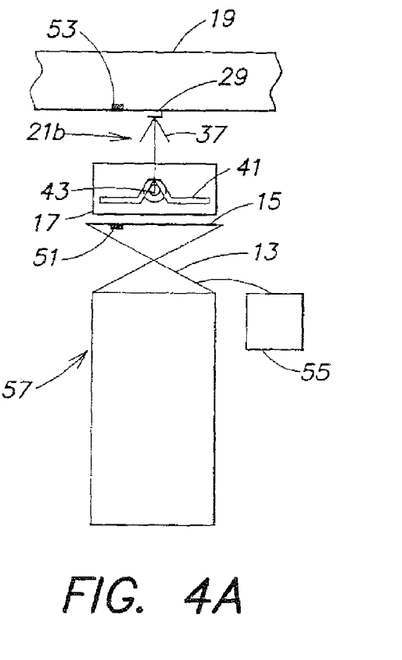
FIGS. 4A-D are schematic side plan views of the overhead transport system and the inventive loadport system.
Figure 5A:
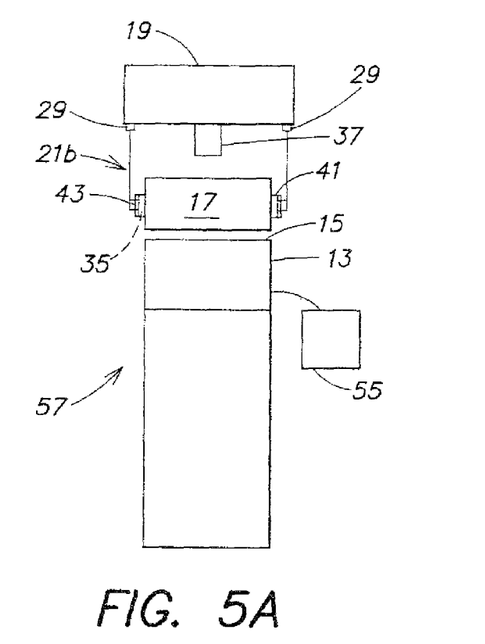
FIGS. 5A-D respectively are the front plan views that correspond to the side views of FIGS. 4A-D.

FIGS. 4A and 5A show the wafer carrier 17 coupled to the transporter 21b, and the wafer carrier 17 positioned above the platform 15. The platform 15 is shown in the retracted position prior to contacting the wafer carrier 17. The receiver 53 outputs a "second signal" because the beam of light transmitted by the light transmitter 51 is blocked by the wafer carrier 17. The microcontroller 55 receives the second signal from the receiver 53, and actuates the lift actuator 13.

Figure 4B:
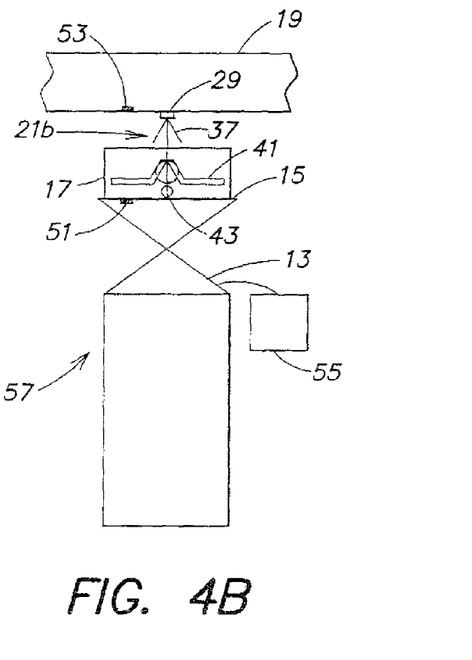
Figure 4C:
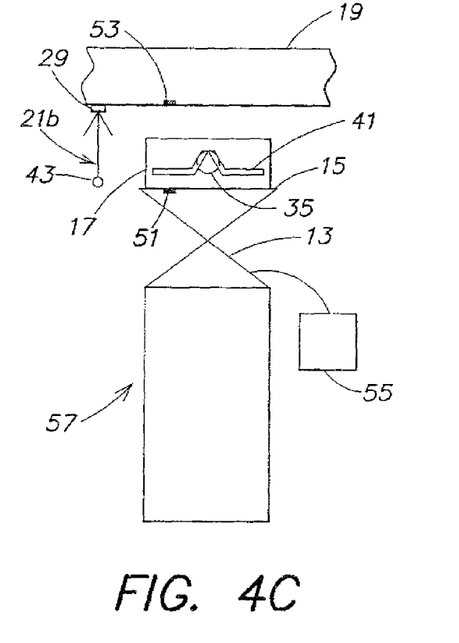
Figure 4D:
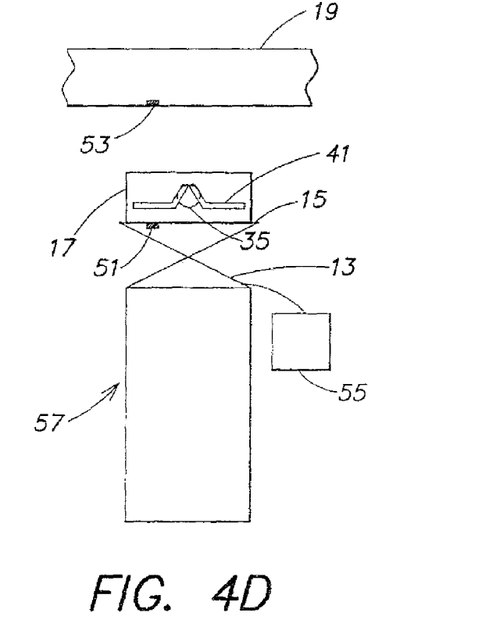
Figure 5B:
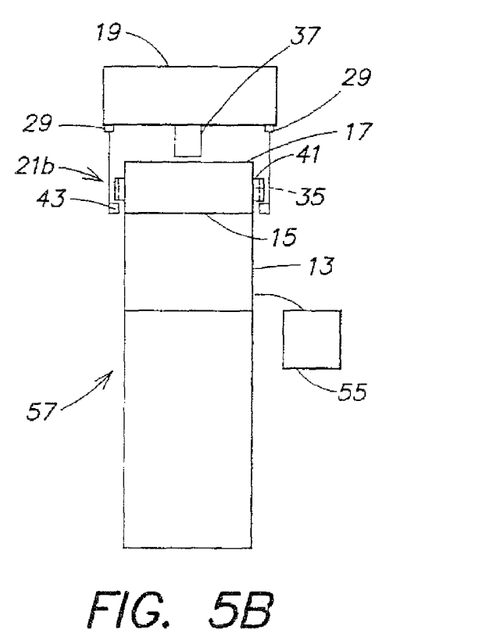
Figure 5C:
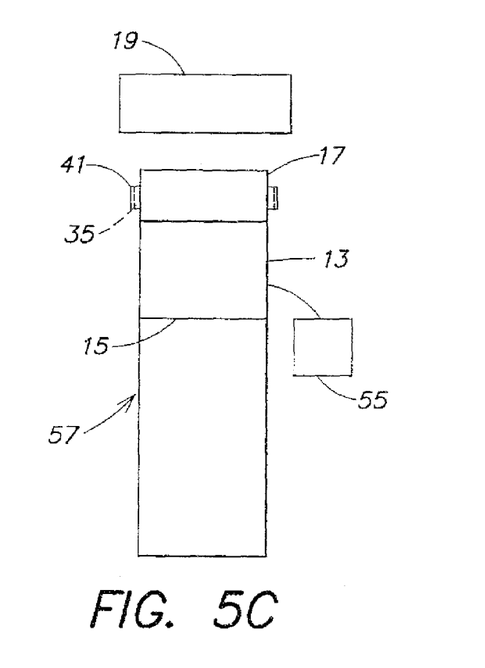
Figure 5D:
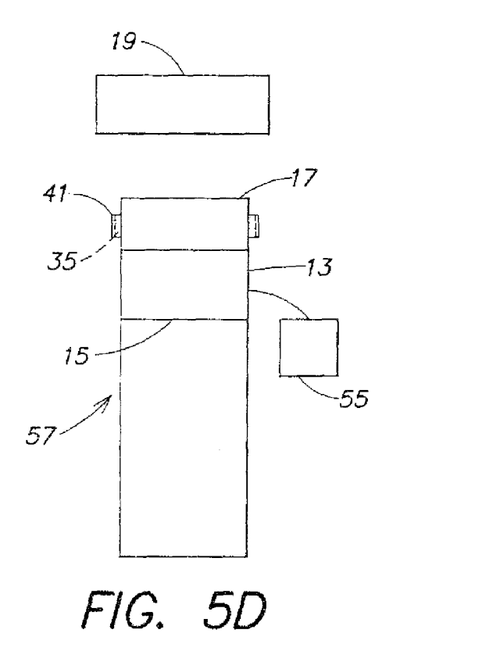

Upon actuation, the lift actuator 13 elevates the platform 15 to the upper position, wherein the platform 15 contacts and elevates the wafer carrier 17 such that the bottom of the inventive V-shaped handle 41 is above the level of the rod 43, thus lifting the wafer carrier 17 off of the transporter 21b. As shown in FIGS. 4B and 5B, the platform 15 is in the upper position and the wafer carrier 17 is positioned thereon. Once the platform 15 is in the upper position and because the inventive V-shaped handle 41 is above the level of the rod 43, the transporter 21b may then move along the overhead transport mechanism 19, as shown in FIGS. 4C and 5C. Thereafter, the lift actuator 13 retracts carrying the platform 15, to the lower position, wherein the robot 45 may access the wafer carrier 17, as shown in FIGS. 4D and 5D. The robot 45 may then transfer the wafer carrier 17 to a storage shelf (FIG. 6) below the platform 15 or to the processing apparatus 63 (FIG. 7).

After all the wafers have been processed in the wafer carrier 17, the inventive overhead transport system 11 may reverse the steps described above, to thereby return the wafer carrier 17 to the overhead transport mechanism 19 for transport to another processing tool. Because the inventive transport system may employ only linear motion, wafer carrier loading and unloading may be more efficient. In one aspect, the overall transfer time may be about 5 to 10 seconds for the wafer carrier 17 to travel between the platform 15 (e.g., when configured as an overhead loadport) and the overhead transport mechanism 19.

When the inventive overhead transport system 11 employs the transporter 21a of FIG. 2 so as to transport a wafer carrier 17 having a conventional bar 26 attached thereto, the operation is similar to that described above. Upon actuation, the lift actuator 13 elevates the platform 15 to the upper position, wherein the conventional bar 26 is above the top of the V-shaped groove 33 of the transporter's end effector 31 a (rather than the V-shaped handle being above the bar shaped end effector 31 as shown in FIG. 3). Thus, the wafer carrier 17 is lifted off of the transporter 21a.

Figure 6:
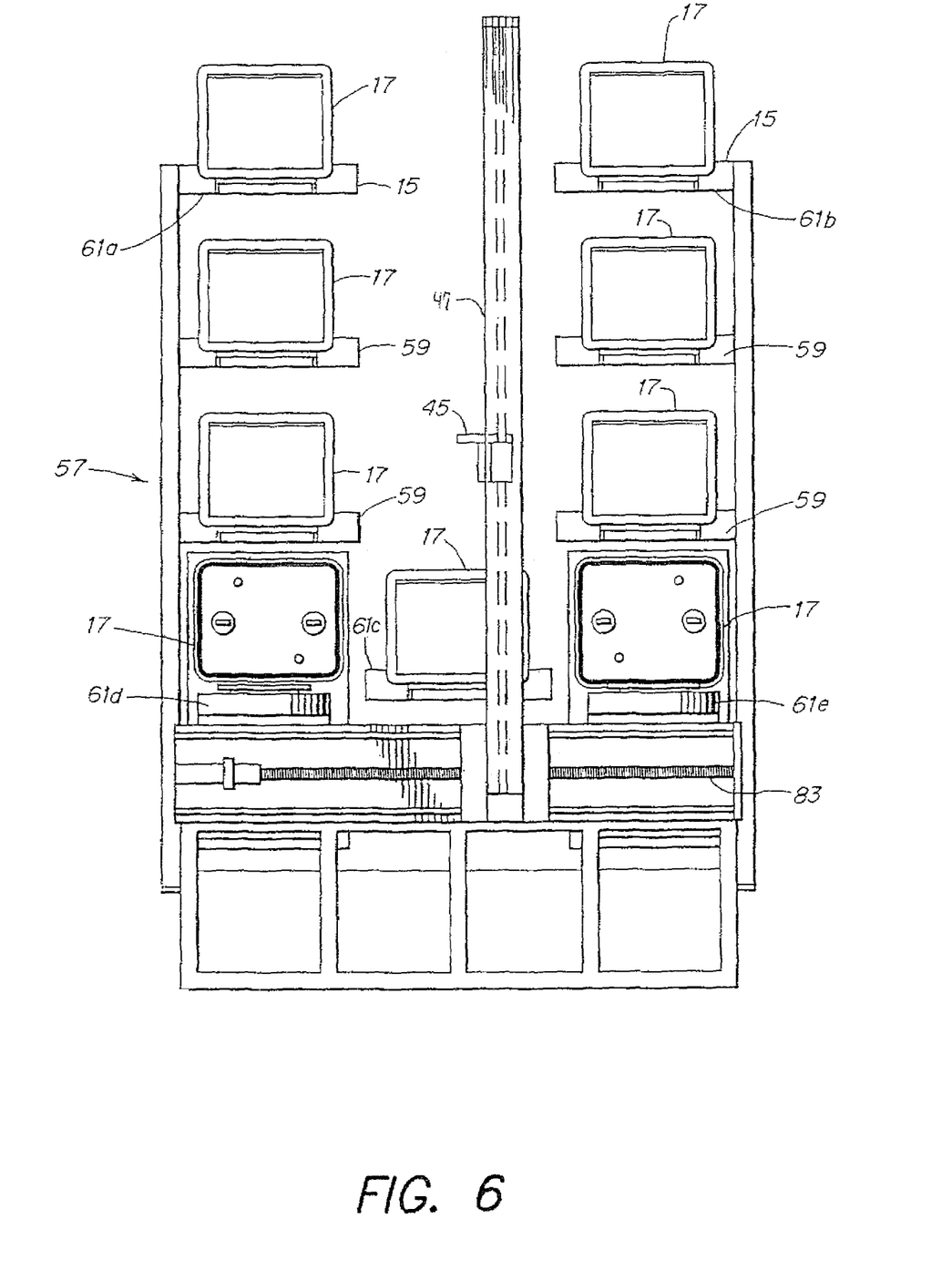
FIG. 6 is a side view of a storage apparatus that may comprise the loading platform.
Figure 7:
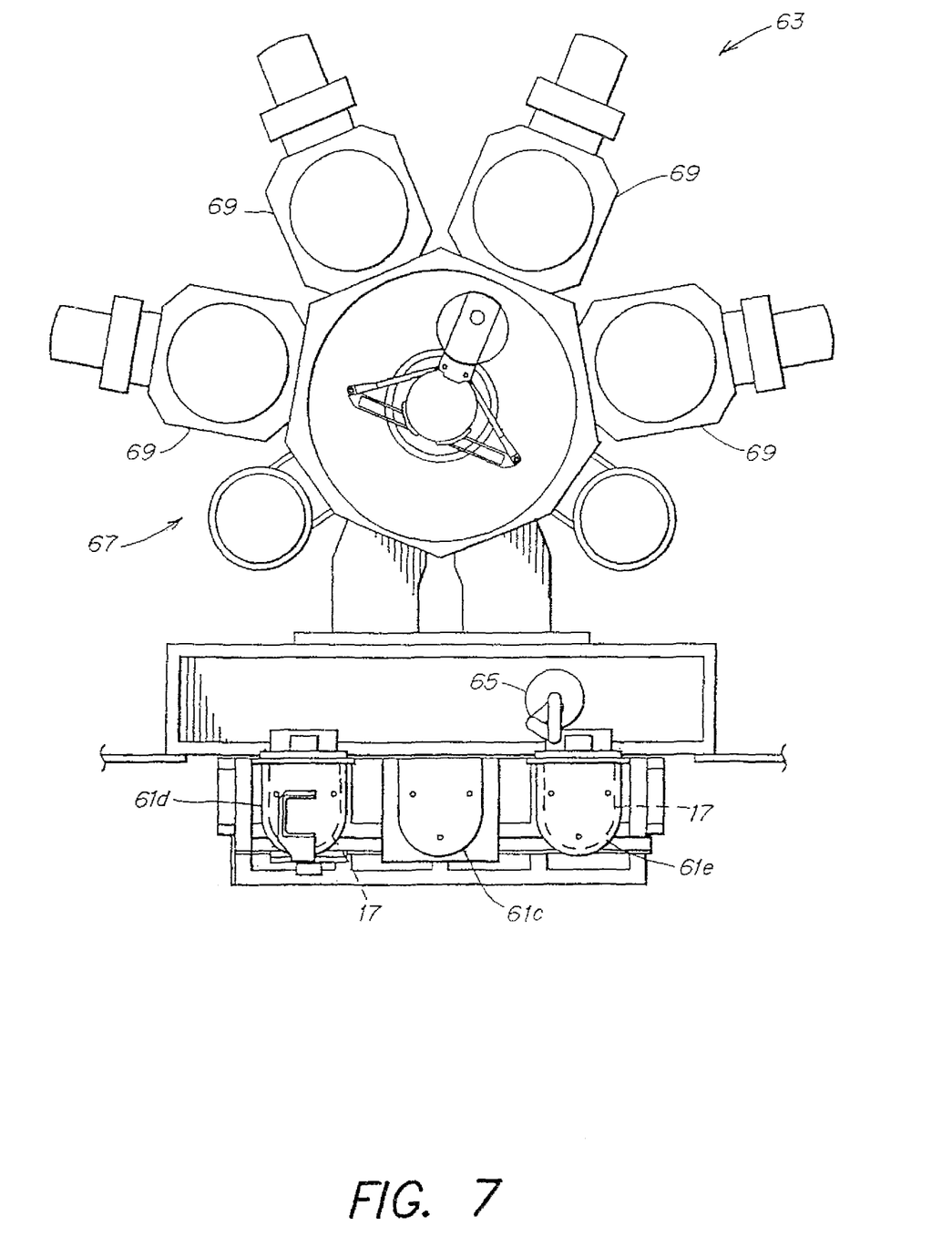
FIG. 7 is a schematic top plan view, in pertinent part, of an overhead transport system coupled to a processing system useful in describing exemplary locations where the inventive loadport may be employed.

FIG. 6 is a side view of a storage apparatus 57 that may comprise the loading platform 15. As stated above, the storage apparatus 57 may comprise a plurality of shelves 59 and a plurality of loadports 61 positioned below the shelves 59 and adjacent a processing system 63 (FIG. 7). In one aspect, the shelves 59 are within the footprint of (e.g., above or below) the loadports 61. The storage apparatus 57 may also comprise a robot 45, which may transfer the wafer carrier 17 between the shelves 59 and the loadports 61a-e. As shown, the loadports 61a-b are overhead loadports, for receiving a wafer carrier from an overhead transport mechanism, and the loadport 61c is a SEMI standard E15 loadport which conventionally receives wafer carriers either manually or from a robot. Because a clear path exists between the loadports 61a-c these loadports may advantageously be configured in accordance with the invention so as to include an actuator as previously described. Similarly the loadports 61d-e, if positioned in front of the shelves 59 rather than below them (e.g., positioned outside the footprint of the shelves 59), may also be configured in accordance with the invention. Accordingly, with use of the present invention a loadport positioned for manual loading at a height set by SEMI Standard E15 may also receive wafer carriers from an overhead transport mechanism. A specific aspect of the storage apparatus 57 is described in detail in U.S. Pat. No. 09/201,737, the entire disclosure of which is incorporated herein by this reference.

FIG. 7 is a schematic top plan view, in pertinent part, of a processing system 63 having a factory interface wafer handler 65 adapted to transport wafers between the plurality of loadports 61c-e and a processing tool 67, which may comprise a plurality of processing chambers 69. FIG. 7 shows exemplary positions in which the inventive loadports 61a-e may be employed.

As is evident from the description above, the inventive overhead transport system 11 may reduce equipment expense and increase equipment reliability. The inventive overhead transport system 11 may allow for loose wafer carrier positioning tolerance when robots are not employed, as wafer carriers need not be positioned as accurately.

It will be understood that, depending on the configuration of the inventive loadport, situations may arise where a wafer carrier being transported by an overhead transport mechanism will need to travel past an overhead loadport that has a wafer carrier positioned thereon. To avoid enough, and the actuator can have a long enough stroke so that there is sufficient vertical space for both wafer carriers. Alternatively, the inventive loadport may have a cantilever extension (not shown) on the platform so that a wafer carrier can be temporarily extended out of the path of the overhead transport mechanism. A further alternative configuration may employ a rotatable platform as shown and described with reference to FIG. 8.

Figure 8:
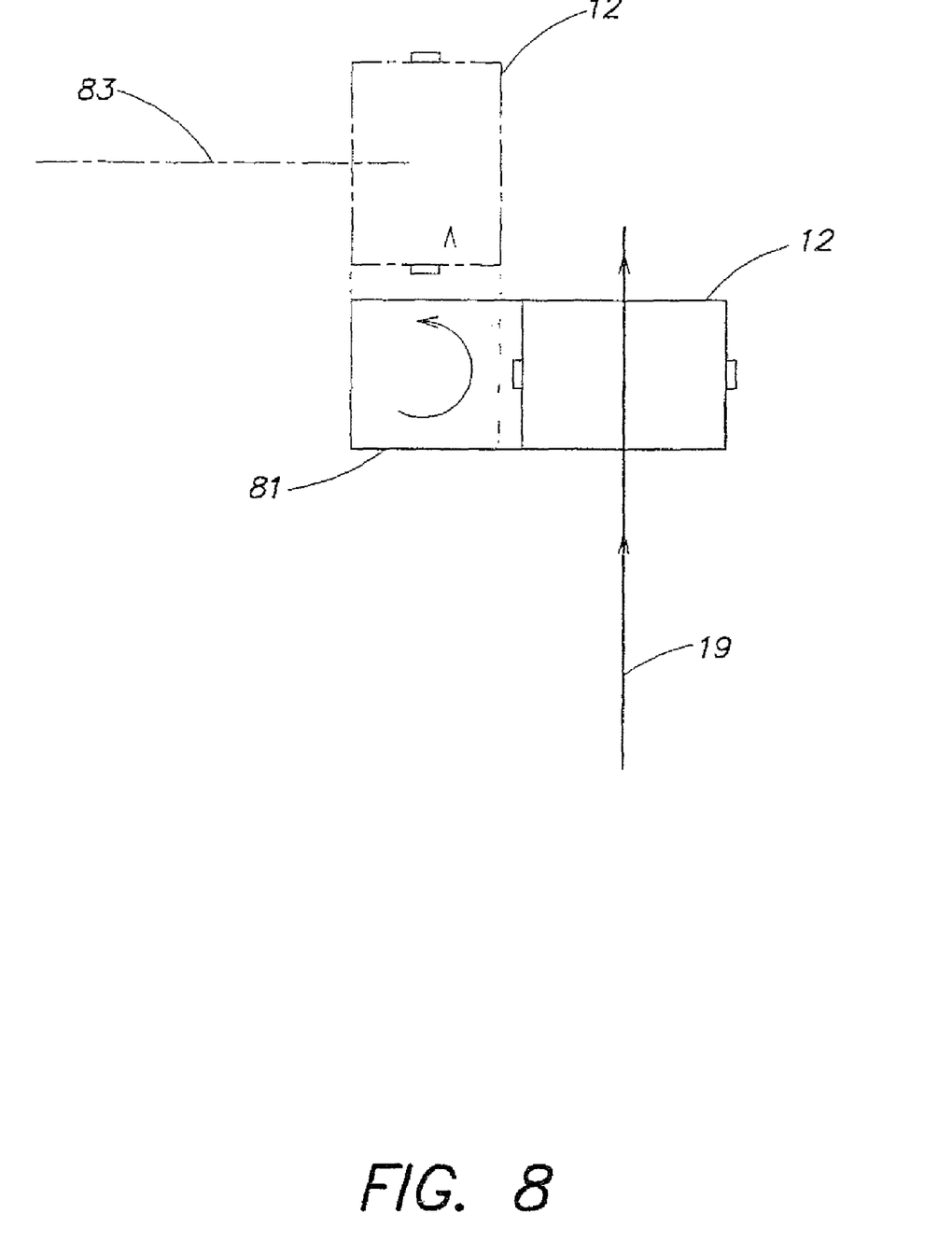
FIG. 8 is a schematic top plan view of an inventive transport system.

FIG. 8 is a schematic top plan view of an inventive transport system that employs a rotatable platform 81 having the inventive loadport 12 (of FIG. 1) mounted thereon. Accordingly, the rotatable platform may be installed below an overhead transport mechanism 19 such that the inventive loadport 12 may be rotated to a position below the overhead transport mechanism 19 such that wafer carriers may be exchanged between the inventive loadport 12 and the overhead transport mechanism 19. After receiving a wafer carrier 17 from the overhead transport mechanism 19, the rotatable platform may rotate to position the wafer carrier 17 at a location where a fabrication tool robot may extract the wafer carrier (e.g., the location shown in phantom).

In the specific aspect shown in FIG. 8, the rotatable platform 81 may be employed within the storage apparatus 57 of FIG. 6 (e.g., the rotatable platform 81 may be employed within the inventive loadport 61b of FIG. 6). In such an aspect, the storage apparatus's robot 47 would move along track 83 (FIG. 6) in order to transport wafer carriers between the inventive loadport (when the rotatable platform 81 is in the location shown in phantom) and the plurality of storage shelves 59 (FIG. 6). Accordingly, the aspect shown in FIG. 8 may be employed within a fabrication system such as that described in a U.S. patent application Ser. No. 09/517,227, filed Mar. 2, 2000 titled "FABRICATION SYSTEM WITH EXTENSIBLE EQUIPMENT SETS", the entire disclosure of which is incorporated herein by reference.

The foregoing description discloses only the exemplary embodiments of the invention, modifications of the above-disclosed apparatus and method which fall within the scope of the invention will be readily apparent to those of ordinary skill in the art. For instance, the transporter 21 may support the wafer carrier 17 via a hook-shaped end effector that couples to the flange positioned on top of a conventional wafer carrier 17. The V-shaped groove 33 may be replaced by any other similar shape.

Accordingly, while the present invention has been disclosed in connection with the preferred embodiments thereof, it should be understood that other embodiments may fall within the spirit and scope of the invention, as defined by the following claims.

What is claimed is:

1. A system for storing and moving wafer carriers, comprising:
   an overhead transport mechanism adapted to support a plurality of wafer carriers and transport the plurality of wafer carriers along a wafer carrier transport path;
   a plurality of transporters adapted to move along the overhead transport mechanism, each transporter including:
      end effectors adapted to engage an inverted v-shaped groove along each lower surface of handles of a wafer carrier, and
      a coupling mechanism adapted to couple the transporter to the overhead transport mechanism;
   a storage apparatus frame adapted to be positioned adjacent the overhead transport mechanism;
   at least one shelf supported by the frame and adapted to support and store a wafer carrier; and
   a movable portion supported by the storage apparatus frame, the movable portion being adapted to extend and retract relative to the frame, so as to contact a wafer carrier supported by the overhead transport mechanism, and so as to remove the wafer carrier from the overhead transport mechanism by elevating the inverted v-shaped grooved handles of the wafer carrier above a level of the end effectors, such that the movable portion supports the wafer carrier and the adjacent overhead transport mechanism no longer supports the wafer carrier.

2. The system of claim 1, wherein the frame supports the movable portion such that the movable portion is vertically aligned with the wafer carrier transport path.

3. The system of claim 1, wherein the at least one shelf supported by the frame comprises a plurality of shelves.

4. The system of claim 1, wherein the frame supports a plurality of shelves arranged in vertical columns and a plurality of loadports are positioned below the shelves within the footprint of the plurality of shelves.

5. The system of claim 1, wherein the frame supports the at least one shelf such that the shelf is below the wafer carrier transport path.

6. The system of claim 1, wherein the movable portion is adapted so as to kinematically couple with a bottom of the wafer carrier.

7. The system of claim 1, wherein the movable portion is vertically aligned with the at least one shelf.

8. The system of claim 1, further comprising a first actuator adapted to extend and retract the movable portion vertically relative to the frame.

9. The system of claim 8, wherein the first actuator lifts each wafer carrier off from each transporter.

10. The system of claim 9, wherein the first actuator comprises a portion of a load port assembly.

11. The system of claim 9, wherein the movable portion is further adapted to extend laterally relative to the frame so as to align with the wafer carrier supported by the overhead transfer mechanism.

12. The system of claim 11, wherein the movable portion is adapted to extend laterally by rotating through an arc relative to the frame.

13. The system of claim 11, wherein the movable portion is adapted to extend laterally by moving linearly relative to the frame.

14. The system of claim 11, wherein the movable portion is adapted to extend laterally beyond a footprint of the frame.

15. The system of claim 1, wherein each of the plurality of end effectors includes a V-shaped groove.

16. The system of claim 1 further comprising a robot adapted to transfer the substrate carriers to a plurality of shelves supported by the frame.

17. The system of claim 1 further comprising a robot including a vertical guide and a horizontal guide, the robot being adapted to move the wafer carriers relative to the frame.

18. A system for storing and moving a plurality of wafer carriers, comprising:
   an overhead transport mechanism adapted to support a plurality of wafer carriers and transport the plurality of wafer carriers along a wafer carrier transport path;
   a plurality of transporters adapted to move along the overhead transport mechanism, each transporter including:
      end effectors adapted to engage an inverted v-shaped groove along each lower surface of handles of a wafer carrier, and
      a coupling mechanism adapted to couple the transporter to the overhead transport mechanism;
   a storage apparatus frame adapted to be positioned adjacent the overhead transport mechanism;
   a robot supported by the frame and adapted to move wafer carriers relative to the frame;
   at least one shelf supported by the frame and adapted to support and store a wafer carrier; and
   a movable portion supported by the frame, the movable portion being adapted to extend and retract relative to the frame, so as to contact a wafer carrier supported by a transporter of the overhead transport mechanism, and so as to remove and disengage the wafer carrier from the transporter of the overhead transport mechanism by elevating the inverted v-shaped grooved handles of the wafer carrier above a level of the end effectors, such that the movable portion supports the wafer carrier and the adjacent overhead transport mechanism no longer supports the wafer carrier.

19. A system for storing and moving a plurality of wafer carriers, comprising:
   an overhead transport mechanism adapted to support a plurality of wafer carriers and transport the plurality of wafer carriers along a wafer carrier transport path;
   a plurality of transporters adapted to move along the overhead transport mechanism, each transporter including:
      end effectors adapted to engage an inverted v-shaped groove along each lower surface of handles on a wafer carrier, and
      a coupling mechanism adapted to couple the transporter to the overhead transport mechanism;
   a storage apparatus frame adapted to be positioned adjacent the overhead transport mechanism;
   a plurality of shelves supported by the frame and adapted to support and store wafer carriers; and
   a wafer carrier transport apparatus supported by the frame, the wafer carrier transport apparatus including a robot adapted to move wafer carriers relative to the frame and wherein the wafer carrier transport apparatus is adapted to extend and retract relative to the frame, so as to contact a wafer carrier supported by a transporter of the overhead transport mechanism so as to remove and disengage the wafer carrier from the transporter of the overhead transport mechanism by elevating the inverted v-shaped grooved handles of the wafer carrier above a level of the end effectors, such that the wafer carrier apparatus supports the wafer carrier and the adjacent overhead transport mechanism no longer supports the wafer carrier.

20. An apparatus for storing and moving wafer carriers, comprising:
   a frame adapted to be positioned adjacent an overhead transport mechanism adapted to support a plurality of wafer carriers and transport the plurality of wafer carriers along a wafer carrier transport path;
   at least one shelf supported by the frame and adapted to support and store a wafer carrier;
   a movable portion supported by the frame, the movable portion being adapted to extend and retract relative to the frame, so as to contact a wafer carrier supported by the overhead transport mechanism, and so as to remove the wafer carrier from the overhead transport mechanism, such that the movable portion supports the wafer carrier and the adjacent overhead transport mechanism no longer supports the wafer carrier; and
   a first actuator adapted to extend and retract the movable portion relative to the frame;
   wherein the movable portion is further adapted to extend laterally relative to the frame so as to align with the wafer carrier supported by the overhead transfer mechanism; and
   wherein the movable portion is adapted to extend laterally by rotating through an arc relative to the frame.

* * * * *